(12) United States Patent
Jung

(10) Patent No.: US 12,040,818 B2
(45) Date of Patent: Jul. 16, 2024

(54) COMMUNICATION DEVICE FOR PERFORMING DETECTION OPERATION AND DEMODULATION OPERATION ON CODEWORD AND OPERATING METHOD THEREOF

(71) Applicant: SAMSUNG ELECTRONICS CO., LTD., Suwon-si (KR)

(72) Inventor: Youngseok Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/046,143

(22) Filed: Oct. 12, 2022

(65) Prior Publication Data

US 2023/0130782 A1   Apr. 27, 2023

(30) Foreign Application Priority Data

Oct. 22, 2021   (KR) ........................ 10-2021-0141970

(51) Int. Cl.
*H03M 13/09*   (2006.01)
*H03M 13/00*   (2006.01)
*H04L 1/00*   (2006.01)

(52) U.S. Cl.
CPC ......... *H03M 13/09* (2013.01); *H03M 13/611* (2013.01); *H04L 1/005* (2013.01)

(58) Field of Classification Search
CPC ............... H03M 13/09; H03M 13/611; H03M 13/1105; H03M 13/2906; H03M 13/3753; H03M 13/2948; H03M 13/2957; H03M 13/3715; H03M 13/635; H03M 13/3746; H04L 1/005; H04L 1/0051; H04L 1/0009; H04L 1/0047; H04L 1/0053
See application file for complete search history.

(56) References Cited

U.S. PATENT DOCUMENTS

| 7,154,936 | B2 | 12/2006 | Bjerke |
| 7,992,073 | B2 | 8/2011 | Orio |
| 8,358,685 | B2 | 1/2013 | Siti et al. |
| 9,042,493 | B2 | 5/2015 | Kolze et al. |
| 9,252,816 | B1 * | 2/2016 | Steiner .............. H03M 13/2909 |
| 9,966,972 | B1 * | 5/2018 | Zhong .................. H04L 1/0051 |
| 2007/0220410 | A1 | 9/2007 | Bae et al. |

FOREIGN PATENT DOCUMENTS

| JP | 5276508 | 8/2013 |
| KR | 10-1216256 | 12/2012 |

* cited by examiner

*Primary Examiner* — Thien Nguyen
(74) *Attorney, Agent, or Firm* — F. CHAU & ASSOCIATES, LLC

(57) ABSTRACT

A method includes calculating a number of iterative detection and decoding (IDD) iterations and a number of decoding iterations for each of a plurality of channel coding units in a target codeword; calculating a demodulation time and a decoding time for the target codeword based on the number of IDD iterations and the number of decoding iterations for the target codeword; adding the target codeword to a codeword set, based on a demodulation time and a decoding time for codewords in the codeword set and the target codeword; and performing an IDD operation based on a number of IDD iterations and a number of decoding iterations.

20 Claims, 12 Drawing Sheets

FIG. 11

| Code word | Code block | Iteration # | DET or EST |
|---|---|---|---|
| 1 | 1 | 1 | O |
| 1 | 1 | 2 | X |
| 1 | 1 | 3 | O |
| ⋮ | | | |
| n | k | i | X |
| ⋮ | | | |
| m | l | j | O |
| ⋮ | | | |

COMMUNICATION DEVICE FOR PERFORMING DETECTION OPERATION AND DEMODULATION OPERATION ON CODEWORD AND OPERATING METHOD THEREOF

CROSS-REFERENCE TO RELATED APPLICATION

This application claims priority under 35 U.S.C. § 119 from Korean Patent Application No. 10-2021-0141970, filed on Oct. 22, 2021 in the Korean Intellectual Property Office, the contents of which are herein incorporated by reference in their entirety.

BACKGROUND

Embodiments of the inventive concept are directed to a communication device, and more particularly, to a communication device that performs a detection operation and a demodulation operation.

A communication device may use an error detection scheme known as cyclic redundancy check (CRC) to detect an error occurring in a transmission process and may use an error correction code known as forward error correction (FEC) to correct an error occurring due to noise. A communication device performs a detection operation and a demodulation operation based on CRC and FEC by segmenting a codeword into code blocks in long term evolution (LTE) and new radio (NR).

SUMMARY

Embodiments of the inventive concept provide a communication device that iteratively performs a detection operation and a demodulation operation for every minimum channel coding unit in a codeword.

According to an embodiment of the inventive concept, a method includes: calculating a number of iterative detection and decoding (IDD) iterations and a number of decoding iterations for each of a plurality of channel coding units in a target codeword; calculating a demodulation time and a decoding time for the target codeword based on the number of IDD iterations and the number of decoding iterations for the target codeword; adding the target codeword to a codeword set, based on a demodulation time and a decoding time for a plurality of codewords in the codeword set and the target codeword; and performing an IDD operation on the codeword set.

According to an embodiment of the inventive concept, a communication device includes: an estimator that estimates a number of IDD iterations and a number of decoding iterations for which no error is detected for an error detection code that corresponds to each of a plurality of channel coding units in each codeword; a controller that calculates a demodulation time and a decoding time for a target codeword based on a number of IDD iterations and a number of decoding iterations for the target codeword and that adds the target codeword to a codeword set, based on a demodulation time and a decoding time for codewords in the codeword set and the target codeword; and an IDD module that performs an IDD operation on the codeword set.

According to an embodiment of the inventive concept, a method for performing an IDD operation on a plurality of codewords includes: determining a global number of iterations and a local number of iterations associated with the IDD operation for every minimum channel coding unit in each of the plurality of codewords; calculating a global processing time and a local processing time for each of the plurality of codewords based on the determined global number of iterations and the determined local number of iterations; and selecting codewords on which the IDD operation is to be performed, based on the global processing time and the local processing time for each of the plurality of codewords.

BRIEF DESCRIPTION OF THE DRAWINGS

FIG. 11 is a table for determining or estimating an IDD operation, according to an embodiment.

DETAILED DESCRIPTION

Hereinafter, embodiments of the inventive concept are described in detail with reference to the accompanying drawings.

Figure 1:
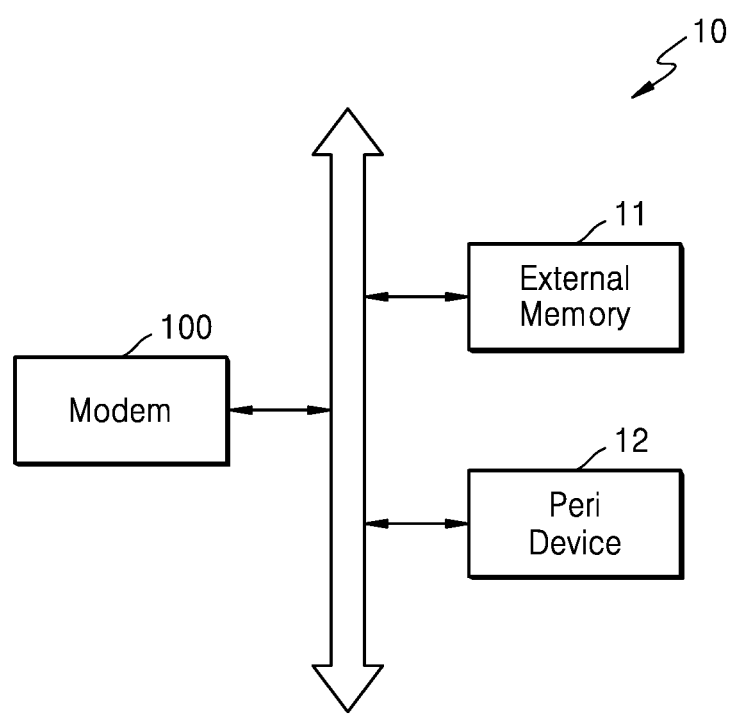
FIG. 1 is a schematic block diagram of a communication device according to an embodiment of the inventive concept.

FIG. 1 is a schematic block diagram of a communication device 10 according to an embodiment of the inventive concept.

Referring to FIG. 1, in an embodiment, the communication device 10 may by any of various kinds of terminals that perform communication, such as a user terminal, a mobile station (MS), or an advanced mobile station (AMS), etc. Examples of a user terminal include devices such as a smartphone, a tablet personal computer (PC), a PC, a mobile phone, a video phone, an e-book reader, or a netbook PC. In an embodiment, the communication device 10 may be a transmission system that transmits data or a reception system that receives data.

The communication device 10 includes a modem 100 that processes a baseband signal, an external memory 11 outside the modem 100, and one or more peripheral devices 12. The modem 100 corresponds to a modem chip implemented by a separate semiconductor chip and mounted in the communication device 10. The communication device 10 further includes a radio frequency (RF) chip, and the RF chip is connected to an antenna to process a high frequency signal. For example, the RF chip converts a high frequency signal received via the antenna into a low frequency signal and transmits the converted low frequency signal to the modem 100. In addition, the RF chip receives a low frequency signal from the modem 100, converts the received low frequency signal into a high frequency signal, and transmits the converted high frequency signal to an external device via the antenna.

According to an embodiment, an application processor is provided that incorporates functions performed by the modem 100, and the modem 100 is included in the application processor. The modem chip described above may be referred to as an application processor.

In addition, according to an embodiment, the external memory 11 shown in FIG. 1 is accessible to each of the modem 100 and the peripheral devices 12 via a shared bus. For example, the external memory 11 may be implemented by a static random access memory (SRAM), a dynamic RAM (DRAM), a synchronous DRAM (SDRAM), or a double data rate (DDR) SDRAM, etc. In addition, the peripheral devices 12 may be included in the communication device 10 and access the external memory 11 and may include various types of devices that can process data, such as a complementary metal oxide semiconductor (CMOS) image sensor, a central processing unit (CPU), etc. In addition, when the communication device 10 includes an application processor, and the modem 100 is implemented by a semiconductor chip separate from the application processor, the peripheral devices 12 may correspond to the application processor.

In various mobile communication standards such as long term evolution (LTE) and high speed packet access (HSPA), a hybrid automatic repeat request (HARQ) function may be applied. For example, in an HARQ operation that accompanies soft combining, when an error occurs in previously transmitted data, the previous data, such as the HARQ data, is stored, and single combined data is generated through HARQ retransmission combination, which may also be referred to as retransmission combination or HARQ combination, using data retransmitted thereafter and the HARQ data. In an error detection operation that determines whether to retransmit data, a cyclical redundancy check (CRC) code is commonly used, but embodiments of the inventive concept are not necessarily limited thereto, and other embodiments use other error detection schemes.

The modem 100 estimates, for every channel coding unit, a number of iterative detection and decoding (IDD) iterations and a number of decoding iterations for generating an acknowledgement (ACK) signal in response to a CRC code based on channel quality. A channel coding unit is a minimum unit for coding a channel within a codeword and may be, for example, a code block in LTE and new radio (NR).

The modem 100 calculates a demodulation time and a decoding time for a codeword by estimating a number of IDD iterations and a number of decoding iterations for every channel coding unit. A demodulation time is a time taken to extract an original information signal from a carrier, and a demodulation time that corresponds to a codeword is a time taken to extract an original information signal that corresponds to the codeword by performing IDD operations on a plurality of channel coding units in the codeword. For example, a demodulation time is proportional to a number of IDD iterations.

The modem 100 calculates a demodulation time and a decoding time for each of a plurality of codewords and selects a codeword on which an IDD operation is to be performed, based on the calculated demodulation times and decoding times. For example, if a time obtained by summing all the demodulation times for a plurality of codewords is a maximum demodulation time or less, and a time obtained by summing all the decoding times for the plurality of codewords is a maximum decoding time or less, the modem 100 performs an IDD operation on all the codewords. The maximum demodulation time and the maximum decoding time are determined according to hardware resources of a demodulator and a decoder available when an IDD operation starts.

Figure 2:
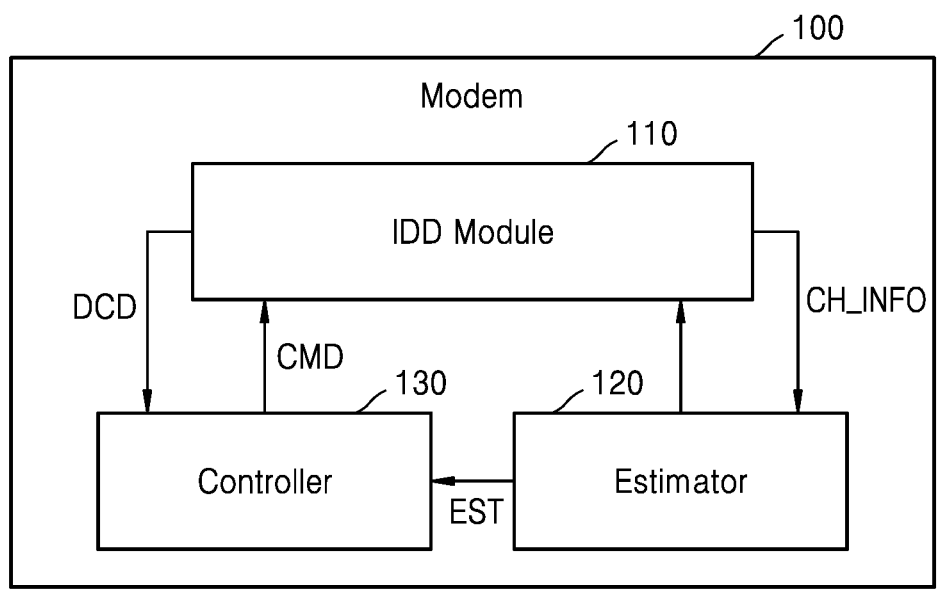
FIG. 2 is a schematic block diagram of a modem according to an embodiment.

FIG. 2 is a schematic block diagram of the modem 100 according to an embodiment.

Referring to FIG. 2, in an embodiment, the modem 100 includes an IDD module 110, an estimator 120, and a controller 130. According to an embodiment, the IDD module 110 includes a fast Fourier transform (FFT) calculator, an effective channel generator, a demodulator, a rate dematching calculator, a forward error correction (FEC) decoder, and a CRC checker. Components included in the IDD module 110 may be configured by separate pieces of hardware or may be included in a single piece of hardware and configured by software units that perform different functions. The IDD module 110 performs a detection operation and a decoding operation on a received signal and controls the RF chip to transmit one of an ACK signal or a negative acknowledgement (NACK) signal to the device that transmitted the received signal, based on a result of the decoding operation.

According to an embodiment of the inventive concept, the IDD module 110 provides channel state information CH_INFO to the estimator 120 and provides a decoding result DCD to the controller 130. The channel state information CH_INFO includes at least one of an FFT calculation result, an effective channel generation result, a log likelihood ratio (LLR), or a rate dematching result, and the estimator 120 estimates channel quality based on the channel state information CH_INFO. For example, the channel quality may include a signal to interference plus noise ratio (SINR), a channel capacity, or a mutual information.

The estimator 120 estimates, based on the channel quality, a number of IDD iterations and a number of decoding iterations needed to not detect an error in a CRC result. For example, when it is determined, based on the channel state information CH_INFO, that the channel quality is good, the estimator 120 estimates a small number of IDD iterations and a small number of decoding iterations for a channel coding unit of a corresponding channel. On the contrary, when it is determined that the channel quality is poor, the estimator 120 estimates a large number of IDD iterations and a large number of decoding iterations for a channel coding unit. The estimator 120 provides an estimation result EST to the controller 130.

The controller 130 determines for every channel coding unit a number of IDD iterations and a number of decoding iterations that maximize performance within hardware processing capabilities of a demodulator and a decoder based on the estimation result EST of the estimator 120. The controller 130 determines the number of IDD iterations and the number of decoding iterations and provides an IDD operation command CMD that corresponds to a channel coding unit to the IDD module 110. For example, the controller 130 provides a number of the IDD operation commands CMD that correspond to the number of IDD iterations, and the IDD module 110 may iteratively performs the IDD operations the number of times specified by the number of IDD iterations.

Figure 3:
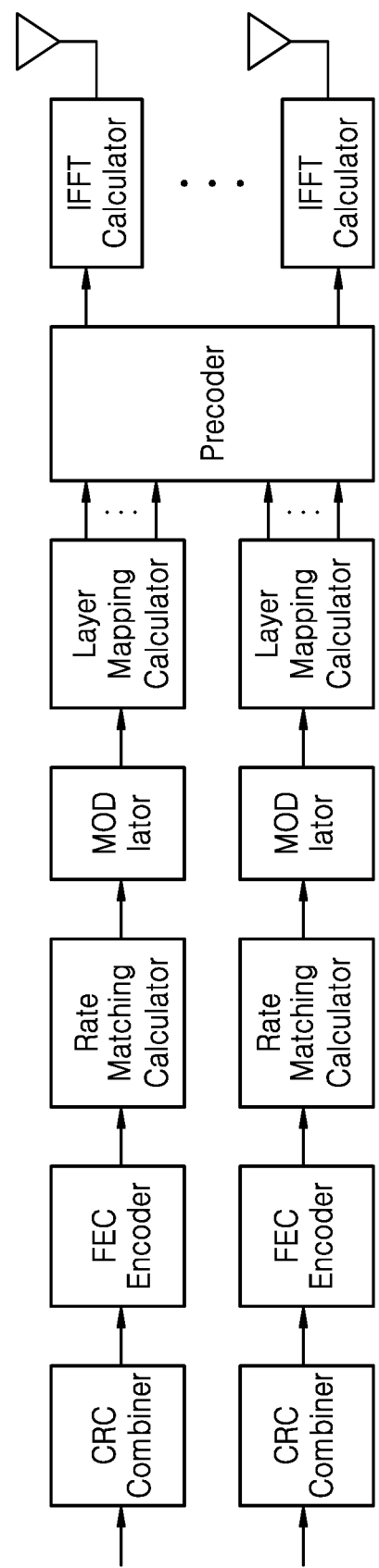
FIG. 3 is a block diagram of a transmission device that generates a plurality of codewords, according to an embodiment.

FIG. 3 is a block diagram of a transmission device that generates a plurality of codewords, according to an embodiment.

FIG. 3 illustrates a transmission device according to an embodiment that generates codewords based on a multiple radio access technology of the third generation partnership project (3GPP), the fourth generation (4G) LTE or the fifth generation (5G) NR, but the multiple radio access technology according to an embodiment of the inventive concept is not necessarily limited thereto. In addition, a transmission structure of a multiple-input multiple-output orthogonal frequency division multiplexing (MIMO OFDM) system is described with reference to FIG. 3, but a system according to an embodiment of the inventive concept is not necessarily limited thereto and may include all systems that perform a demodulation operation, a decoding operation, and a detection operation in a reception device.

Information bits are received and classified into a codeword that is a channel decoding input unit. CRC is an error detection scheme that is used to detect an error occurring in a transmission process, and FEC is an error correction code that is used to correct an error that occurs due to noise. A codeword in LTE and NR is segmented into code blocks that are channel coding units.

Referring to FIG. 3, the transmission device includes a CRC combiner, an FEC encoder, a rate matching calculator, a modulator, a layer mapping calculator, a precoder, and an inverse FFT (IFFT) calculator. The transmission device of FIG. 3 generates a transmission signal by using a transmission structure of a MIMO OFDM system and includes a plurality of CRC combiners, a plurality of FEC encoders, a plurality of rate matching calculators, a plurality of modulators, and a plurality of layer mapping calculators, but an embodiment of the inventive concept is not necessarily limited thereto and may include one CRC combiner, one FEC encoder, one rate matching calculator, one modulator, and one layer mapping calculator. Components included in the transmission device may be configured by separate pieces of hardware or be included in a single piece of hardware and configured as software units that perform different functions.

The CRC combiner combines CRC that detects an error with every channel coding unit, and the FEC encoder encodes CRC-combined data into a previously determined code for each multiple radio access technology. For example, for FEC, a convolution code, a turbo code, a low-density parity-check (LDPC) code, or a polar code may be used, and in LTE, a convolution code may be used for control channel, and a turbo code may be used for traffic channel. In 5G NR, a polar code may be used for control channel, and an LDPC code may be used for traffic channel.

The rate matching calculator matches encoded data bits with the number of modulation symbols allocated to each user when the encoded data bits do not match the allocated number of modulation symbols. For example, the rate matching calculator iterates bits if the number of encoded data bits is less than the required number of bits, and clip bits if the number of encoded data bits is greater than the required number of bits.

The modulator maps data into a signal constellation, and the layer mapping calculator distributes a complex signal mapped by the modulator so as to be matched with the number of input layers of the precoder. The precoder applies a precoding matrix selected from channel information. The transmission device feeds the channel information back to a base station or uses channel reciprocity. The IFFT calculator converts a transmission antenna-specific output signal from a frequency domain, which is received from the precoder, into a time domain and outputs the time-domain transmission antenna-specific output signal via an antenna.

Figure 4:
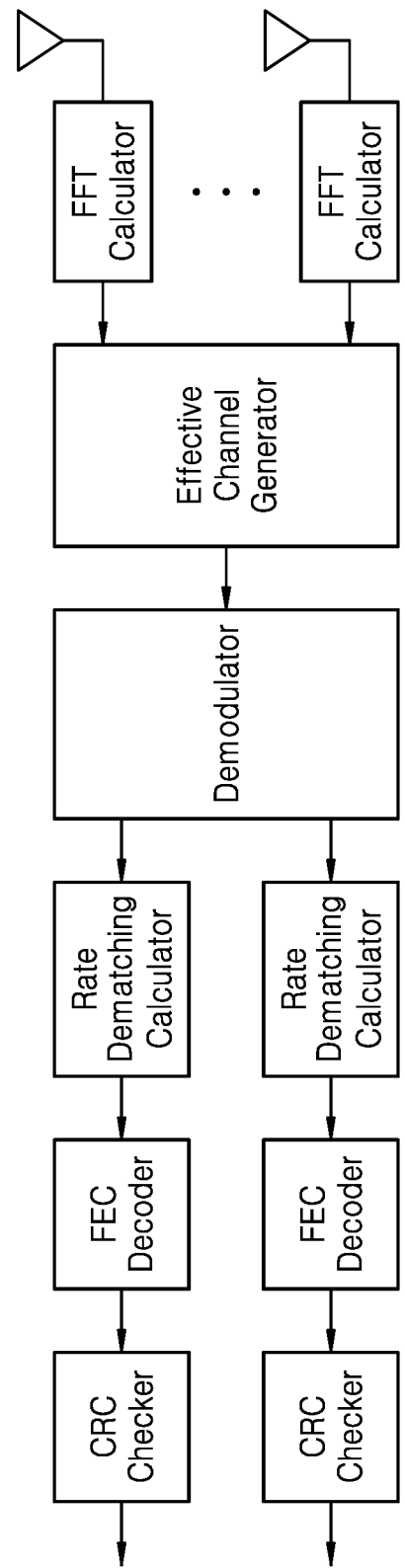
FIG. 4 is a block diagram of a reception device that performs a detection operation and a demodulation operation, according to an embodiment.

FIG. 4 is a block diagram of a reception device that performs a detection operation and a demodulation operation, according to an embodiment.

Referring to FIG. 4, a reception device according to an embodiment includes a CRC checker, an FEC decoder, a rate dematching calculator, a demodulator, an effective channel generator, and an FFT calculator. The reception device of FIG. 4 includes a plurality of CRC checkers, a plurality of FEC decoders, a plurality of rate dematching calculators, and a plurality FFT calculators, but an embodiment of the inventive concept is not necessarily limited thereto and may include one CRC checker, one FEC decoder, one rate dematching calculator, and one FFT calculator. The reception device receives a reception signal via an antenna, and the FFT calculator converts a time domain signal of the reception signal into a frequency domain signal. A precoding matrix is selectively used by the effective channel generator to generate a channel estimation value. When a reference signal (RS) used for channel estimation is a cell-specific RS signal commonly used for reception devices, precoding that is normally applied to data is not applied to the RS, and thus, the effective channel generator may generate a channel estimation value based on the precoding. On the contrary, for a UE-specific RS and a demodulation RS of 5G NR, precoding applied to data is applied to an RS as well, and thus, the effective channel generator does not consider the precoding to generate a channel estimation value.

The demodulator generates an LLR value by using an effective channel generated by the effective channel generator and the reception signal. The generated LLR value is rate-dematched by the rate dematching calculator and then delivered to the FEC decoder. The FEC decoder decodes the received data, and the CRC checker detects errors of decoded information bits, and determines whether to retransmit, or, if no error is detected, whether to deliver the decoded information bits to a higher layer.

Figure 5:
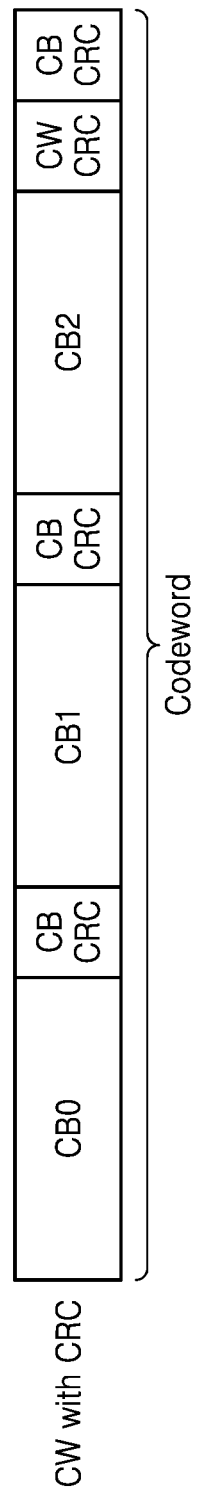
FIG. 5 illustrates a configuration of a codeword generated according to an embodiment.

FIG. 5 illustrates a configuration of a codeword generated according to an embodiment.

Referring to FIG. 5, in an embodiment, one codeword includes a plurality of code blocks CB0 to CB2, and CRC codes CB CRC that correspond to the plurality of code blocks CB0 to CB2, and a CRC code CW CRC that corresponds to one codeword is included in data transmitted from a transmission system.

According to an embodiment of the inventive concept, a channel coding unit is a code block, a modem iteratively performs a detection operation and a decoding operation on a code block unit, and a number of iterations are determined. In addition, the modem updates the determined number of iterations while performing a detection operation and a decoding operation. Hereinafter, a method, performed by the modem, of determining a number of iterations and a method, performed by the modem, of updating the determined number of iterations are described in detail.

Figure 6:
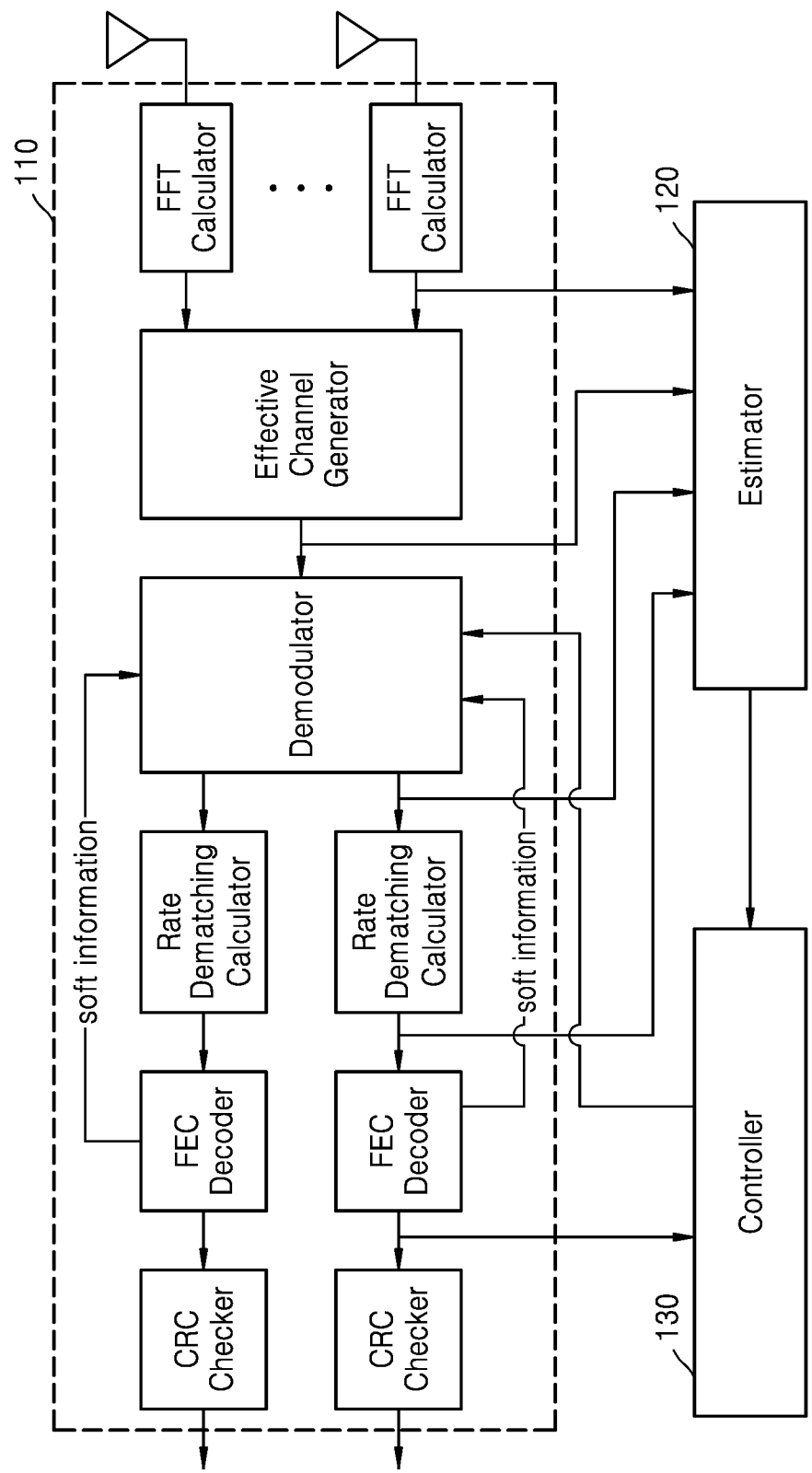
FIG. 6 is a schematic block diagram of a communication device that determines a number of iterative detection and decoding (IDD) iterations and a number of decoding iterations for every channel coding unit, according to an embodiment of the inventive concept.

FIG. 6 is a schematic block diagram of a communication device that determines a number of IDD iterations and a number of decoding iterations for every channel coding unit, according to an embodiment of the inventive concept.

Referring to FIG. 6, a communication device according to an embodiment of the inventive concept includes the IDD module 110, the estimator 120, and the controller 130, and the IDD module 110 iteratively performs a detection operation and a decoding operation. The estimator 120 estimates a number of IDD iterations and a number of decoding iterations for every channel coding unit by receiving channel state information for estimating channel quality from the IDD module 110, and the controller 130 outputs a command based on the determined number of IDD iterations and the determined number of decoding iterations so that the IDD module 110 performs a detection operation and a decoding operation.

According to an embodiment, an FEC decoder delivers soft information to a demodulator, and the demodulator generates an LLR value based on the soft information received from the FEC decoder and delivers the generated LLR value to the FEC decoder. The FEC decoder performs decoding by using the generated LLR value. The communication device performs, by the determined number of IDD iterations, an IDD operation that delivers soft information to the demodulator and performs decoding by using an LLR value generated based on the soft information. The soft information is information about probabilities of whether a bit in the FEC decoder was a '0' or a '1', and is a ratio of the probabilities that a bit was a '0' or a '1', which is similar to an LLR value, and may be referred to as extrinsic information or priori information.

The estimator 120 estimates, based on channel quality for each channel coding unit, a number of IDD iterations and a number of decoding iterations needed to generate an ACK signal as a CRC result. When, due to poor channel quality, it is predicted that the communication device generates a NACK signal even though the communication device iteratively performs a detection operation and a decoding operation by a maximum number of IDD iterations and a maximum number of decoding iterations, the estimator 120 sets a number of IDD iterations and a number of decoding iterations needed for a corresponding channel coding unit as minimum values to reduce power consumption. In this case, the number of IDD iterations and the number of decoding iterations may be 1 and 0, respectively. Even when generating a NACK signal, the communication device needs a demodulation operation to generate an LLR for combining with a signal retransmitted by an HARQ operation, and thus, the estimator 120 sets the number of IDD iterations to be 1.

The estimator 120 estimates channel quality by receiving generated channel state information, such as at least one of an FFT calculation result, an effective channel generation result, an LLR value, or a rate dematching result, from the IDD module 110. The estimated channel quality may include an SINR, a channel capacity, or mutual information. According to an embodiment, the estimator 120 infers a number of IDD iterations and a number of decoding iterations by using a neural network model based on the channel state information and the channel quality.

The controller 130 determines a number of IDD iterations and a number of decoding iterations for every channel coding unit that maximize performance within hardware processing capabilities of the demodulator and the FEC decoder based on the estimation result generated by the estimator 120. The number of decoding iterations is the number of times that a decoding operation is iteratively performed in the FEC decoder for each IDD operation. The number of decoding iterations is set differently for each of a number of IDD iterations, and the number of IDD iterations in a demodulation operation is referred to as a global number of iterations, and the number of decoding iterations is referred to as a local number of iterations.

Figure 7:
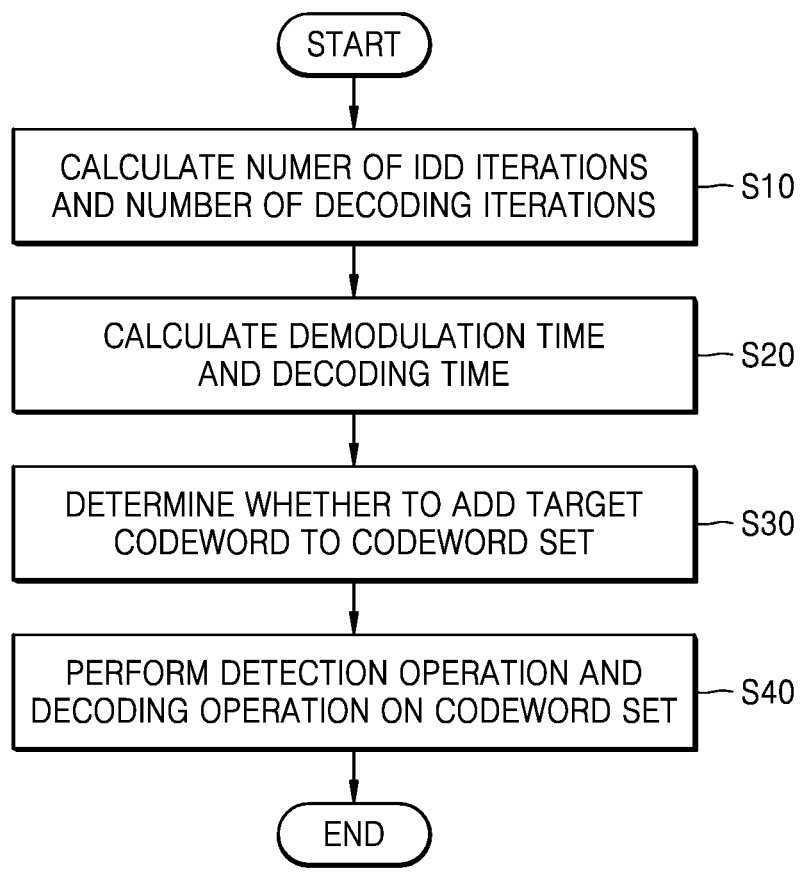
FIG. 7 is a flowchart of a method of operating a communication device, according to an embodiment of the inventive concept.

FIG. 7 is a flowchart of a method of operating a communication device, according to an embodiment of the inventive concept.

Referring to FIG. 7, in an embodiment, the communication device calculates a demodulation time and a decoding time for a channel coding unit in a target codeword that is one of a plurality of codewords and determines whether the target codeword is included in a codeword set. Referring to FIG. 6, the controller 130 receives a number of IDD iterations and a number of decoding iterations estimated for every channel coding unit from the estimator 120 and calculates a demodulation time and a decoding time for the target codeword. Hereinafter, the target codeword is assumed to be an nth codeword, where n is a positive integer, of the plurality of codewords, and a target channel coding unit that calculates a demodulation time and a decoding time in the target codeword is a kth channel coding unit, where k is a positive integer.

In operation S10, the communication device estimates and generates a number of IDD iterations and a number of decoding iterations needed to generate an ACK signal that corresponds to a CRC of the target channel coding unit in the target codeword. The number of IDD iterations of the target channel coding unit is $g_{idd}(n,k)$, and the number of decoding iterations performed in an ith IDD operation, where i is a positive integer, of the target channel coding unit is $g_{dec}(n,k,i)$. When an ACK signal that corresponds to the CRC cannot be generated due to poor channel quality, the number of IDD iterations for the target channel coding unit is 1, and the number of decoding iterations therefor is 0.

In LTE, when it is predicted that a response signal corresponding to CRC for even one target channel coding unit in the target codeword is NACK, the communication device sets the number of IDD iterations to 1 and the number of decoding iterations to 0 for all the channel coding units in the target codeword to reduce power consumption. In LTE, because a response signal of a physical data shared channel (PDSCH) is transmitted in a codeword unit, the communication device sets the number of IDD iterations to 1 and the number of decoding iterations to 0 for all channel coding units in a channel coding unit group to minimize power consumption. When a response signal predicted based on the estimated number of IDD iterations and the estimated number of decoding iterations differs from a response signal generated after performing an actual IDD operation, the number of IDD iterations and the number of decoding iterations are updated during the IDD operation.

In operation S20, the communication device calculates a demodulation time and a decoding time for the target codeword based on the estimated number of IDD iterations and the estimated number of decoding iterations. The communication device calculate $f_{demod}(n,k,i)$, a time needed for a demodulator to generate an LLR value in an ith IDD operation on the target channel coding unit, and calculates $f_{dec}(n,k,i,g_{dec}(n,k,i))$, a time for an FEC decoder to perform $g_{dec}(n,k,i)$th decoding operation. In this case, when a response signal predicted for a channel coding unit is a NACK signal, even if the number of decoding iterations is 0, $f_{dec}(n,k,i,g_{dec}(n,k,i))$ may not be 0 but a time for generating an LLR value or a corresponding time because a decoding operation on other channel coding units that generate the LLR value is not guaranteed.

Processing times $f_{demod}(n)$ and $f_{dec}(n)$ respectively needed for the demodulator and the FEC decoder for the target codeword are represented by Equation 1.

$$f_{demod}(n) = \Sigma_{k=1}^{K_n} \Sigma_{i=1}^{g_{idd}(n,k)} f_{demod}(n,k,i)$$

$$f_{dec}(n)=\Sigma_{k=1}^{Kn}\Sigma_{i=1}g_{idd}(n,k)f_{dec}(n,k,i,g_{dec}(n,k,i)),\quad \text{Equation 1:}$$

where Kn denotes the number of channel coding units in the target codeword.

When a NACK signal is predicted as a response signal because a processing capability for the target codeword is not guaranteed, the required fdemod,nack(n) and fdec,nack (n) are represented by Equation 2.

$$f_{demod,nack}(n)=\Sigma_{k=1}^{Kn}f_{demod}(n,k,1),$$

$$f_{dec,nack}(n)=\Sigma_{k=1}^{Kn}f_{dec}(n,k,1,0).\quad \text{Equation 2:}$$

When a NACK signal is estimated as a response signal for even one channel coding unit in the target codeword even though an IDD operation is performed by a at least a maximum number of IDD iterations, a response signal estimation value that corresponds to all channel coding units in the target codeword is set as a NACK signal to minimize power consumption.

In operation S30, the communication device determines whether to add a target codeword into a codeword set, based on the calculated demodulation time and decoding time. When one piece of hardware processes several numerologies, demodulator and decoder hardware resources that may be ensured for each numerology (or subcarrier spacing) or are occupied at present are referred to as a maximum demodulation time $F_{demod}$ and a maximum decoding time $F_{dec}$, respectively.

The codeword set is a set of codewords on which an IDD operation is to be performed, and the communication device puts the target codeword into the codeword set and determines whether a sum of demodulation times and a sum of decoding times for codewords included in the codeword set satisfy Equation 3.

$$f_{demod}(C_{idd})=\Sigma_{n\in C_{idd}}f_{demod}(n)+\Sigma_{n\in C_{forced\_nack}}f_{demod,nack}(n)\le F_{demod},$$

$$f_{dec}(C_{idd})=\Sigma_{n\in C_{idd}}f_{dec}(n)+\Sigma_{n\in C_{forced\_nack}}f_{dec,nack}(n)\le F_{dec},\quad \text{Equation 3:}$$

where $C_{idd}$ denotes a codeword set, and $C_{forced\_nack}$ denotes a set of codewords for which it is predicted to generate a NACK signal. Accordingly, the communication device determines whether each of a plurality of codewords is included in the codeword set, and according to an embodiment, the communication device determines whether codewords are included in the codeword set in a codeword order determined based on compensation values, described below.

In operation S40, the communication device performs a detection operation and a decoding operation on the determined codeword set.

Figure 8:
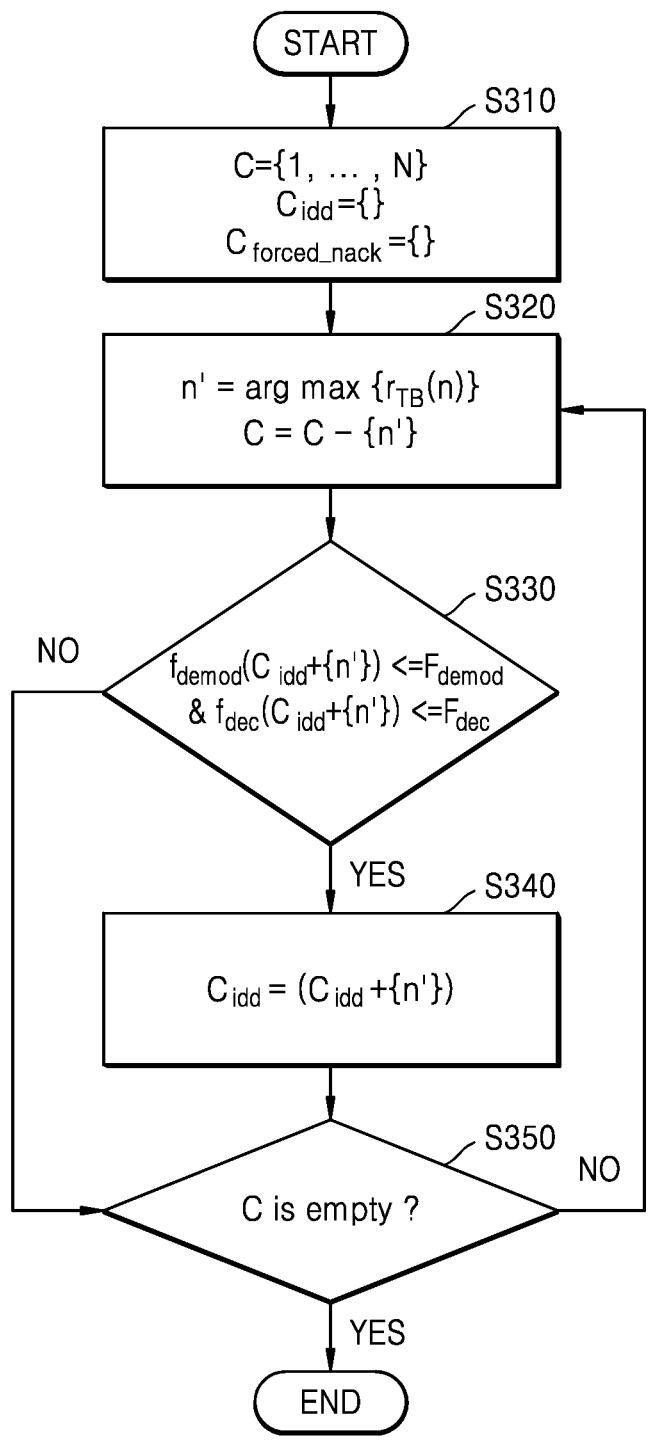
FIG. 8 is a flowchart of a method of determining a codeword set, according to an embodiment.

FIG. 8 is a flowchart of a method of determining a codeword set, according to an embodiment.

Referring to FIG. 8, in an embodiment, a communication device determines whether each of a plurality of codewords is included in the codeword set in a codeword order determined based on compensation values. The compensation values are determined according to degrees of significance of the plurality of codewords. For example, the compensation values are determined based on at least one of an average transmission speed, a frequency efficiency, or a codeword transmission block size, e.g., a maximum transmittable code block size, determined by considering an adaptive modulation and coding (AMC) operation of a base station. The compensation value of a codeword may be a weight of the codeword.

In operation S310, N codewords, where N is a positive integer, are selected as a whole codeword set C, and a codeword set $C_{idd}$ and a set $C_{forced\_nack}$ of codewords for which it is predicted to generate a NACK signal are initialized.

In operation S320, the communication device selects, as a codeword n', a codeword that has the greatest compensation value in the whole codeword set and excludes the codeword n' from the whole codeword set.

In operation S330, the communication device determines whether a sum of demodulation times for the codeword n' and codewords included in the codeword set $C_{idd}$ is a maximum demodulation time or less, and determines whether a sum of decoding times for the codeword n' and the codewords included in the codeword set $C_{idd}$ is a maximum decoding time or less.

In operation S340, the communication device puts the codeword n' into the codeword set $C_{idd}$ if it is determined that the sum of demodulation times is the maximum demodulation time or less, and the sum of decoding times is the maximum decoding time or less.

Otherwise, in operation S350, the communication device does not put the codeword n' into the codeword set $C_{idd}$ and determines whether a codeword remains in the whole codeword set C, if it is determined that the sum of demodulation times is greater than the maximum demodulation time, or the sum of decoding times is greater than the maximum decoding time. If a codeword remains in the whole codeword set C, the method proceeds to operation S320, otherwise, an operation of determining the codeword set may end.

That is, according to the embodiment of FIG. 8, the communication device determines a codeword set so that a sum of compensation values of codewords in the codeword set is maximized, by determining whether codewords included in the codeword set in an order degree of significance. However, a method performed by the communication device of determining a codeword set so that a sum of compensation values of codewords included in the codeword set is maximized, according to embodiments of the inventive concept, is not necessarily limited to an embodiment of FIG. 8.

Figure 9:
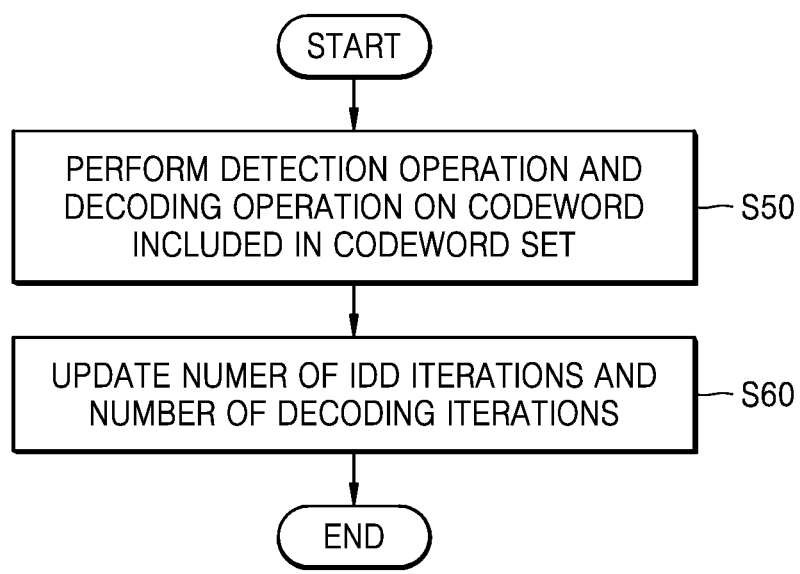
FIG. 9 is a flowchart of a method of updating a number of IDD iterations and a number of decoding iterations, according to an embodiment.

FIG. 9 is a flowchart of a method of updating a number of IDD iterations and a number of decoding iterations, according to an embodiment.

Referring to FIG. 9, in an embodiment, a communication device acquires a decoding result of an FEC decoder while performing a detection operation and a decoding operation and update s a number of IDD iterations and a number of decoding iterations based on the acquired result. A controller of the communication device sequentially acquires an estimation result from an estimator and a decoding result while performing an IDD operation.

In operation S50, the communication device performs a detection operation and a decoding operation on a codeword in a codeword set. In operation S60, the communication device updates a number of IDD iterations and a number of decoding iterations for channel coding units based on the decoding result acquired while performing the detection operation and the decoding operation. For example, the communication device determines an IDD operation order as an order of a codeword that has a greater compensation value. Codeword indices for codewords ordered by increasing compensation value are set by Equation 4.

$$r(0)\ge r(1)\ge \ldots \ge r(n).\quad \text{Equation 4:}$$

Hereinafter, a method performed by a communication device of setting some of IDD operations as an estimation-enabled IDD group according to whether an IDD operation is determined or an estimation result is available, and updating a number of IDD iterations and a number of decoding iterations based on the set IDD group, is described with reference to FIGS. 10 and 11.

Figure 10:
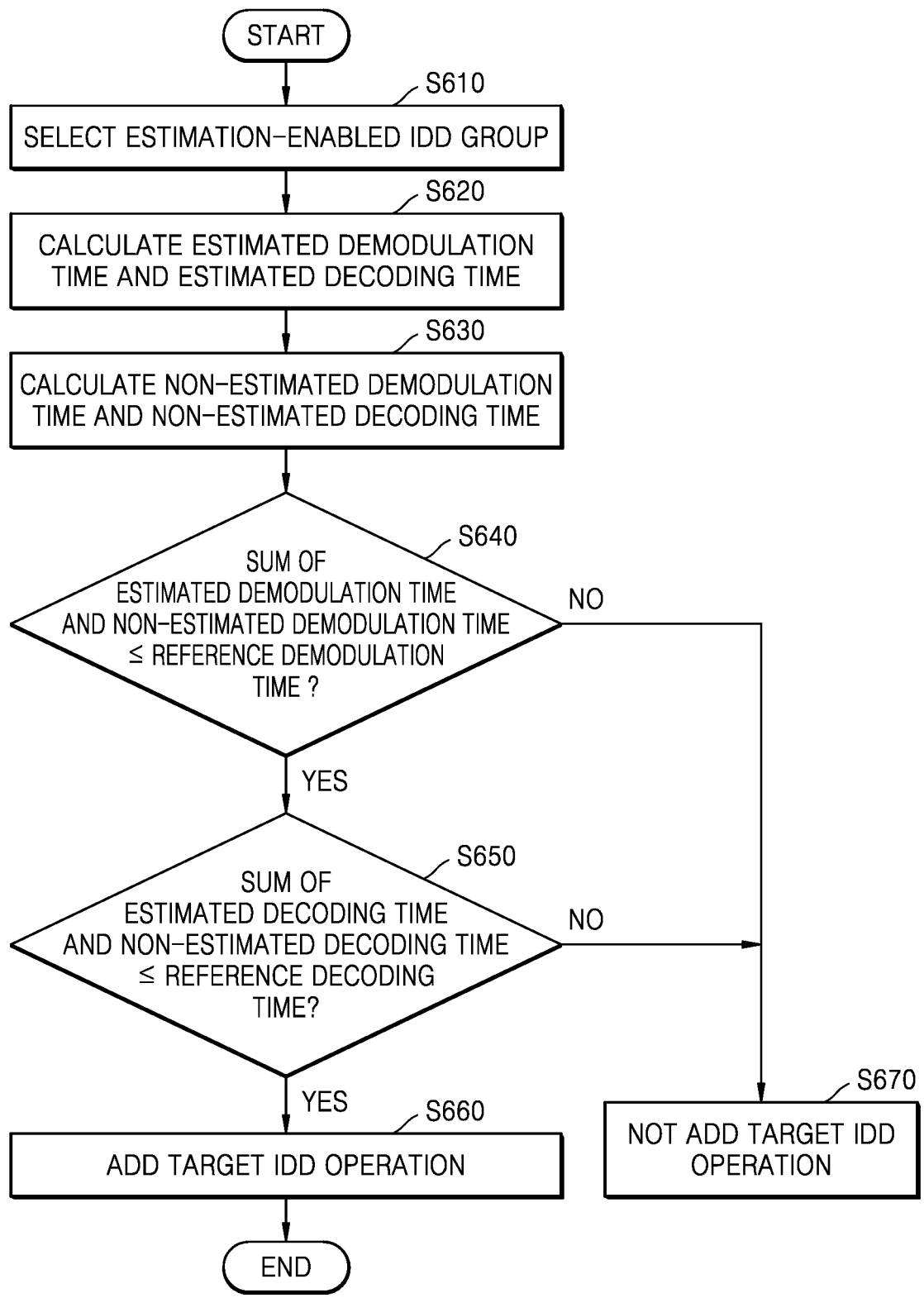
FIG. 10 is a flowchart of a method of determining whether to add a target IDD operation, according to an embodiment.

FIG. 10 is a flowchart of a method of determining whether to add a target IDD operation, according to an embodiment, and FIG. 11 is a table for determining (DET) or estimating (EST) an IDD operation, according to an embodiment.

Referring to FIG. 10, in an embodiment, the communication device selects, as an estimation-enabled IDD group, some IDD operations based on the numbers of iterations when determining whether to add a target IDD operation, and determines whether to add the target IDD operation by calculating a predicted demodulation time and a predicted decoding time based on the selected IDD group. Hereinafter, the target IDD operation is a jth IDD operation on an lth channel coding unit of an mth codeword, where m, l, and j are positive integers.

In operation S610, the communication device may selects, as an estimation-enabled IDD group, an ith IDD operation on a kth channel coding unit of an nth codeword for which an IDD operation is already determined or an estimation result is available. On the contrary, when an IDD operation is not determined, and an estimation result is not available, the ith IDD operation on the kth channel coding unit of the nth codeword is selected as an estimation-disabled IDD group. According to an embodiment, an indication function value $I_{m,l,j}(n,k,i)$ is set to 1 for estimation-enabled IDD operations, and the indication function value $I_{m,l,j}(n,k,i)$ is set to 0 for estimation-disabled IDD operations.

Referring to FIG. 11, in an embodiment, a first IDD operation on a first code block of a first codeword is in a deterministic or estimation-enabled state, and a second IDD operation on the first code block of the first codeword is in a non-deterministic and estimation-disabled state. Accordingly, the first IDD operation is classified as an estimation-enabled IDD operation, and thus, $I_{m,l,j}(1,1,1)$ is set to 1, and the second IDD operation is classified as an estimation-disabled IDD operation, and thus, $I_{m,l,j}(1,1,2)$ is set to 0. Likewise, the ith IDD operation on the kth code block of the nth codeword is classified as an estimation-disabled IDD operation, and thus, $I_{m,l,j}(n,k,i)$ is set to 0, and the jth IDD operation on the lth code block of the mth codeword is classified as an estimation-enabled IDD operation, and thus, $I_{m,l,j}(m,l,j)$ is set to 1.

In operation S620, the communication device calculates an estimated demodulation time and an estimated decoding time for the estimation-enabled IDD group. According to an embodiment, the communication device calculates the estimated demodulation time by summing demodulation times for IDD operations in the estimation-enabled IDD group and calculates the estimated decoding time by summing decoding times for the IDD operations. An estimated demodulation time $f_{known,demod}^{m,l,j}$ and an estimated decoding time $f_{known,dec}^{m,l,j}$ for a target IDD operation are represented by Equation 5.

$$f_{known,demod}^{m,l,j} = \Sigma_{n \in C} \Sigma_{k=1}^{K_n} \Sigma_{i=1}^{Iter_{idd,max}} I_{m,l,j}(n,k,i) \times f_{demod}(n,k,i),$$

$$f_{known,dec}^{m,l,j} = \Sigma_{n \in C} \Sigma_{k=1}^{K_n} \Sigma_{i=1}^{Iter_{idd,max}} I_{m,l,j}(n,k,i) \times f_{dec}(n,k,i,g_{dec}(n,k,i)),$$

Equation 5:

where $Iter_{idd,max}$ denotes a maximum number of IDD iterations, and demodulation times and decoding times are summed only for IDD operations of which an indication function value is 1.

In operation S630, the communication device calculates a non-estimated demodulation time and a non-estimated decoding time for the estimation-disabled IDD group. A non-estimated demodulation time $f_{unknown,demod}^{m,l,j}$ and a non-estimated decoding time $f_{unknown,dec}^{m,l,j}$ for the target IDD operation are represented by Equation 6.

$$f_{unknown,demod}^{m,l,j} = \Sigma_{n \in C} \Sigma_{k=1}^{K_n} \Sigma_{i=1}^{Iter_{min(n,k)}} (1 - I_{m,l,j}(n,k,i)) \times f_{demod}(n,k,i),$$

$$f_{unknown,dec}^{m,l,j} = \Sigma_{n \in C} \Sigma_{k=1}^{K_n} \Sigma_{i=1}^{Iter_{min(n,k)}} (1 - I_{m,l,j}(n,k,i)) \times f_{dec}(n,k,i,g_{dec,min}(n,k,i)),$$

Equation 6:

where $Iter_{min(n,k)}$ denotes a minimum number of IDD iterations allocatable to the kth code block of the nth codeword, and $g_{dec,min}(n,k,i)$ denotes a minimum number of decoding iterations allocatable to the ith IDD operation.

In operations S640 and S650, the communication device determines whether a sum of the estimated demodulation time and the non-estimated demodulation time is a reference demodulation time or less, and whether a sum of the estimated decoding time and the non-estimated decoding time is a reference decoding time or less, by using Equation 7.

$$f_{known,demod}^{m,l,j} + f_{unknown,demod}^{m,l,j} \leq F_{demod},$$

$$f_{known,dec}^{m,l,j} + f_{unknown,dec}^{m,l,j} \leq F_{dec},$$

Equation 7 where the reference demodulation time is the same as the maximum demodulation time $F_{demod}$ according to an embodiment of FIG. 7, and the reference decoding time is the same as the maximum decoding time $F_{dec}$ according to an embodiment of FIG. 7. However, the reference demodulation time and the reference decoding time according to an embodiment of the inventive concept may differ from the maximum demodulation time and the maximum decoding time, respectively.

In operation S660, the communication device adds the target IDD operation if the indication function value $I_{m,l,j}(m,l,j)$ of the target IDD operation is 1, if the sum of the estimated demodulation time and the non-estimated demodulation time is the reference demodulation time or less, and if the sum of the estimated decoding time and the non-estimated decoding time is the reference decoding time or less. If the indication function value $I_{m,l,j}(m,l,j)$ of the target IDD operation is 0, the communication device updates information by using Equation 8, compares the sum of the estimated demodulation time and the non-estimated demodulation time with the reference demodulation time, and compares the sum of the estimated decoding time and the non-estimated decoding time with the reference decoding time.

$$I_{m,l,j}(m,l,j)=1, f_{demod}(m,l,j)=1, g_{dec}(m,l,j)=g_{dec,min}(m,l,j).$$

Equation 8:

In operation S670, the communication device determines that the target IDD operation is not added if it is determined that the sum of the estimated demodulation time and the non-estimated demodulation time is greater than the reference demodulation time, or that the sum of the estimated decoding time and the non-estimated decoding time is greater than the reference decoding time.

Figure 12:
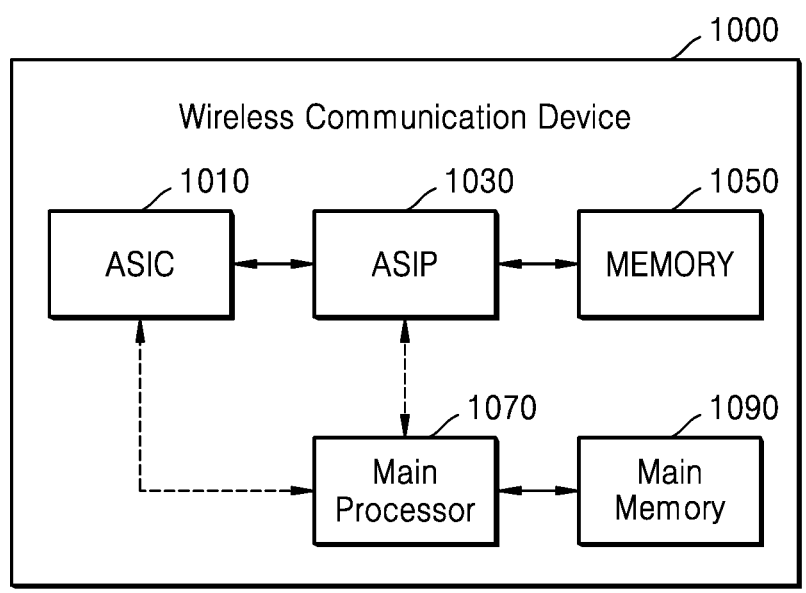
FIG. 12 is a block diagram of a wireless communication device according to an embodiment.

FIG. 12 is a block diagram of a wireless communication device 1000 according to an embodiment.

Referring to FIG. 12, in an embodiment, the wireless communication device 1000 includes an application specific integrated circuit (ASIC) 1010, an application specific instruction set processor (ASIP) 1030, a memory 1050, a main processor 1070, and a main memory 1090. At least two of the ASIC 1010, the ASIP 1030, and the main processor 1070 can communicate with each other. In addition, at least two of the ASIC 1010, the ASIP 1030, the memory 1050, the main processor 1070, and the main memory 1090 may be embedded in a single chip.

The ASIP 1030 is an integrated circuit customized for a particular usage, supports an exclusive instruction set for a particular application, and executes instructions in that instruction set. The memory 1050 communicates with the ASIP 1030 and stores, as a non-transitory storage device, a plurality of instructions to be executed by the ASIP 1030. For example, the memory 1050 is, as a non-limiting example, a random type of memory accessible by the ASIP 1030, such as RAM, read-only memory (ROM), a tape, a magnetic disk, an optical disc, a volatile memory, a non-volatile memory, or a combination thereof.

The main processor 1070 controls the wireless communication device 1000 by executing a plurality of instructions. For example, the main processor 1070 controls the ASIC 1010 and the ASIP 1030 and processes data received over a wireless communication network or user input to the wireless communication device 1000. The main memory 1090 communicates with the main processor 1070 and stores, as a non-transitory storage device, a plurality of instructions to be executed by the main processor 1070. For example, the main memory 1090 is, as a non-limiting example, a random type of memory accessible by the main processor 1070, such as RAM, ROM, a tape, a magnetic disk, an optical disc, a volatile memory, a nonvolatile memory, or a combination thereof.

An aforementioned wireless communication method according to an embodiment of the inventive concept can be performed by at least one component in the wireless communication device 1000 of FIG. 12. In some embodiments, at least one operation of a wireless communication method is implemented by a plurality of instructions stored in the memory 1050. The ASIP 1030 performs at least a portion of at least one operation of a wireless communication method by executing the plurality of instructions stored in the memory 1050. In some embodiments, at least one operation of a wireless communication method is implemented by a hardware block designed through logic synthesis, etc., and included in the ASIC 1010. In some embodiments, at least one operation of the wireless communication method is implemented by a plurality of instructions stored in the main memory 1090, and the main processor 1070 performs at least a portion of at least one operation of the wireless communication method by executing the plurality of instructions stored in the main memory 1090.

While embodiments of the inventive concept have been particularly shown and described with reference to the drawings, it will be understood that various changes in form and details may be made therein without departing from the spirit and scope of the following claims.

What is claimed is:

1. A modem that performs method steps for performing an iterative detection and decoding (IDD) operations on a plurality of codewords, the method steps comprising:
    obtaining the plurality of codewords generated from a signal received via an antenna;
    performing error detection and decoding on the plurality of codewords; and
    generating an information signal based on the decoded plurality of codewords,
    wherein performing the error detection and decoding comprises:
    calculating a number of iterative detection and decoding (IDD) iterations and a number of decoding iterations for each of a plurality of channel coding units in a target codeword of the plurality of codewords;
    calculating a demodulation time and a decoding time for the target codeword based on the number of IDD iterations and the number of decoding iterations for the target codeword;
    adding the target codeword to a codeword set, based on a demodulation time and a decoding time for the plurality of codewords in the codeword set and the target codeword; and
    performing an IDD operation on the codeword set wherein the decoded plurality of codewords is generated.

2. The method of claim 1, wherein calculating the number of IDD iterations and the number of decoding iterations comprises estimating a number of IDD iterations and a number of decoding iterations for which no error is detected for an error detection code that corresponds to each of a plurality of channel coding units in each codeword.

3. The method of claim 2, wherein estimating the number of IDD iterations and the number of decoding iterations comprises estimating the number of IDD iterations and the number of decoding iterations for each of the plurality of channel coding units based on a channel quality of each of the plurality of channel coding units.

4. The method of claim 3, wherein estimating the number of IDD iterations and the number of decoding iterations comprises setting the number of IDD iterations and the number of decoding iterations to a minimum when an error is detected for the error detection code by a first number of IDD iterations or more and a second number of decoding iterations or more that correspond to at least one channel coding unit in the target codeword.

5. The method of claim 1, wherein each of the plurality of channel coding units is a code block.

6. The method of claim 1, wherein the number of decoding iterations includes a number of forward error correction (FEC) decoding iterations for an IDD operation that corresponds to each of the number of IDD iterations.

7. The method of claim 1, wherein the demodulation time includes a time for generating log-likelihood ratios (LLRs) for the plurality of channel coding units based on the number of IDD iterations and the number of decoding iterations.

8. The method of claim 1, wherein adding the target codeword to the codeword set comprises determining that the target codeword is included in the codeword set when a sum of a demodulation time for codewords in the codeword set and the demodulation time for the target codeword is a first demodulation time or less, and when a sum of a decoding time for the codewords in the codeword set and the decoding time for the target codeword is a first decoding time or less.

9. The method of claim 1, further comprising selecting the target codeword in an order of a increasing compensation value for each of the plurality of codewords in the codeword set.

10. The method of claim 9, wherein the compensation value for each codeword in the codeword set is a codeword weight determined based on at least one of an average transmission speed, a spectrum efficiency, or a maximum transmittable code block size.

11. The method of claim 1, further comprising increasing at least one of a number of IDD iterations or a number of decoding iterations for the plurality of channel coding units based on the calculated number of IDD iterations and the calculated number of decoding iterations.

12. The method of claim 11, wherein increasing at least one of the number of IDD iterations or the number of decoding iterations comprises determining whether to increase the number of IDD iterations by the calculated number of IDD iterations or whether to increase the number of decoding iterations by the calculated number of decoding iterations in an order of increasing compensation value for the plurality of codewords.

13. The method of claim 12, wherein determining whether to increase the number of IDD iterations or whether to increase the number of decoding iterations comprises selecting, as an estimation-enabled IDD group, an IDD operation that is already determined to be performed or for which it is determined that estimation information is available among IDD operations on the plurality of channel coding units, when determining whether to add a target IDD operation.

14. The method of claim 13, wherein determining whether to increase the number of IDD iterations or whether to increase the number of decoding iterations comprises:
calculating an estimated demodulation time and an estimated decoding time for IDD operations in the estimation-enabled IDD group;
calculating a non-estimated demodulation time and a non-estimated decoding time for IUD operations that remain by excluding the estimation-enabled IDD group from a plurality of IDD operations; and
determining that the target operation is added, when a sum of the estimated demodulation time and the non-estimated demodulation time is a reference demodulation time or less and when a sum of the estimated decoding time and the non-estimated decoding time is a reference decoding time or less.

15. A communication device, comprising:
an estimator configured to estimate a number of iterative detection and decoding (IDD) iterations and a number of decoding iterations for which no error is detected for an error detection code that corresponds to each of a plurality of channel coding units in each codeword;
a controller configured to calculate a demodulation time and a decoding time for a target codeword based on a number of IDD iterations and a number of decoding iterations for the target codeword and that adds the target codeword to a codeword set based on a demodulation time and a decoding time for codewords in the codeword set and the target codeword; and
an IDD module configured to perform an IDD operation on the codeword set,
wherein the IDD module is configured to:
receive a plurality of codewords generated from a signal received via an antenna;
perform error detection and decoding on the plurality of codewords; and
generate an information signal based on the decoded plurality of codewords.

16. The communication device of claim 15, wherein the estimator is further configured to estimate the number of IDD iterations and the number of decoding iterations for each of the plurality of channel coding units based on a channel quality of each of the plurality of channel coding units.

17. The communication device of claim 15, wherein the controller is further configured to add the target codeword to the codeword set when a sum of a demodulation time for codewords in the codeword set and the demodulation time for the target codeword is a first demodulation time or less, and when a sum of a decoding time for the codewords in the codeword set and the decoding time for the target codeword is a first decoding time or less.

18. The communication device of claim 15, wherein the controller is further configured to increase at least one of a number of IDD iterations or a number of decoding iterations for the plurality of channel coding units based on the estimated number of IDD iterations and the estimated number of decoding iterations.

19. A modem to perform a method for performing an iterative detection and decoding (IDD) operation on a plurality of codewords, the method comprising:
obtaining the plurality of codewords generated from a signal received via an antenna;
performing error detection and decoding on the plurality of codewords; and
generating an information signal based on the decoded plurality of codewords,
wherein performing the error detection and decoding comprises:
determining a global number of iterations and a local number of iterations associated with the IDD operation for every minimum channel coding unit in each of the plurality of codewords;
calculating a global processing time and a local processing time for each of the plurality of codewords based on the determined global number of iterations and the determined local number of iterations; and
selecting codewords on which the IDD operation is to be performed, based on the global processing time and the local processing time for each of the plurality of codewords.

20. The method of claim 19, further comprising updating the global number of iterations and the local number of iterations when a communication device performs the IDD operation.

* * * * *